United States Patent
Li et al.

(10) Patent No.: US 10,840,145 B2
(45) Date of Patent: Nov. 17, 2020

(54) VERTICAL FIELD-EFFECT TRANSISTOR DEVICES WITH NON-UNIFORM THICKNESS BOTTOM SPACERS

(71) Applicant: International Business Machines Corporation, Armonk, NY (US)

(72) Inventors: Juntao Li, Cohoes, NY (US); Kangguo Cheng, Schenectady, NY (US); ChoongHyun Lee, Rensselaer, NY (US); Shogo Mochizuki, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 16/289,148

(22) Filed: Feb. 28, 2019

(65) Prior Publication Data

US 2020/0279779 A1   Sep. 3, 2020

(51) Int. Cl.
*H01L 29/66* (2006.01)
*H01L 29/78* (2006.01)
(Continued)

(52) U.S. Cl.
CPC .. *H01L 21/823468* (2013.01); *H01L 21/2251* (2013.01); *H01L 21/3086* (2013.01);
(Continued)

(58) Field of Classification Search
CPC .......... H01L 29/66795; H01L 29/7848; H01L 29/66545; H01L 29/0847; H01L 29/41725; H01L 29/41741; H01L 29/7827; H01L 29/7831; H01L 29/6656; H01L 29/66772; H01L 27/0886; H01L 27/088; H01L 21/28079; H01L 21/76895; H01L 21/823431; H01L 21/8238; H01L 21/823885; H01L 21/823871;
(Continued)

(56) References Cited

U.S. PATENT DOCUMENTS 9,318,608 B1 * 4/2016 Harley ................ H01L 29/7851
9,627,511 B1   4/2017 Cheng et al.
(Continued)

*Primary Examiner* — Natalia A Gondarenko
(74) *Attorney, Agent, or Firm* — Douglas Pearson; Ryan, Mason & Lewis, LLP

(57) ABSTRACT

Device structures and methods are provided for fabricating vertical field-effect transistor devices with non-uniform thickness bottom spacers to achieve increased device performance. For example, a semiconductor substrate surface is etched to form semiconductor fins having bottom portions with concave sidewall surfaces that undercut upper portions of the fins. A doped epitaxial source/drain layer is formed on the concave sidewall surfaces, wherein portions of the doped epitaxial source/drain layer disposed between the fins have a raised curved surface. A bottom spacer layer is formed on the doped epitaxial source/drain layer, wherein portions of the bottom spacer layer disposed between the fins have a curved-shaped profile with a non-uniform thickness. A thermal anneal process is performed to drive dopants from the doped epitaxial source/drain layer into the bottom portions of the fins to form source/drain extension regions with sharp junctions between the source/drain extension regions and channel regions of the fins.

16 Claims, 13 Drawing Sheets

(51) Int. Cl.
 H01L 29/417 (2006.01)
 H01L 21/306 (2006.01)
 H01L 21/324 (2006.01)
 H01L 21/225 (2006.01)
 H01L 21/3065 (2006.01)
 H01L 29/06 (2006.01)
 H01L 29/36 (2006.01)
 H01L 21/8234 (2006.01)
 H01L 27/088 (2006.01)
 H01L 21/308 (2006.01)

(52) U.S. Cl.
 CPC .... H01L 21/324 (2013.01); H01L 21/823418 (2013.01); H01L 21/823437 (2013.01); H01L 21/823487 (2013.01); H01L 27/088 (2013.01); H01L 29/6656 (2013.01); H01L 29/66666 (2013.01); H01L 29/7827 (2013.01)

(58) Field of Classification Search
 CPC ....... H01L 21/823878; H01L 21/76829; H01L 21/762; H01L 21/8232; H01L 21/238; H01L 21/823481; H01L 21/823456; H01L 21/823821; H01L 21/823864; H01L 21/82385; H01L 29/6681; H01L 29/0642; H01L 29/785; H01L 29/7855; H01L 29/66787; H01L 27/11553; H01L 27/1158; H01L 27/11582; H01L 27/1104; H01L 27/0924; H01L 29/41758; H01L 29/41766; H01L 29/41783; H01L 29/66636; H01L 29/66696; H01L 29/66719; H01L 29/6653; H01L 29/66553; H01L 29/66689; H01L 29/66727; H01L 29/66803; H01L 29/167; H01L 29/0865; H01L 29/0869; H01L 29/0882–0886; H01L 29/7854; H01L 29/66833; H01L 21/823468; H01L 21/3086; H01L 21/324; H01L 21/823418; H01L 21/2251; H01L 21/823487; H01L 21/823437; H01L 21/76877; H01L 29/66666; H01L 21/30604; H01L 21/3085; H01L 21/823814; H01L 29/41791
 USPC ........ 257/368, 347; 438/478, 151, 595, 305, 438/591, 664
 See application file for complete search history.

(56) References Cited

U.S. PATENT DOCUMENTS

| | | |
|---|---|---|
| 9,691,850 B2 | 6/2017 | Cheng et al. |
| 9,761,727 B2 | 9/2017 | Mallela et al. |
| 9,793,378 B2 | 10/2017 | Loubet et al. |
| 9,929,246 B1 | 3/2018 | Cheng et al. |
| 9,941,391 B2 | 4/2018 | Gluschenkov et al. |
| 9,991,365 B1 | 6/2018 | Cheng et al. |
| 2005/0142828 A1* | 6/2005 | Kammler ............ H01L 29/6656 438/595 |
| 2013/0032876 A1 | 2/2013 | Cheng et al. |
| 2013/0228862 A1* | 9/2013 | Lee .................. H01L 21/30604 257/347 |
| 2017/0229558 A1* | 8/2017 | Anderson ........... H01L 21/3086 |
| 2018/0040716 A1* | 2/2018 | Cheng ............... H01L 29/66795 |
| 2018/0331213 A1* | 11/2018 | Bentley ................. H01L 29/785 |

* cited by examiner

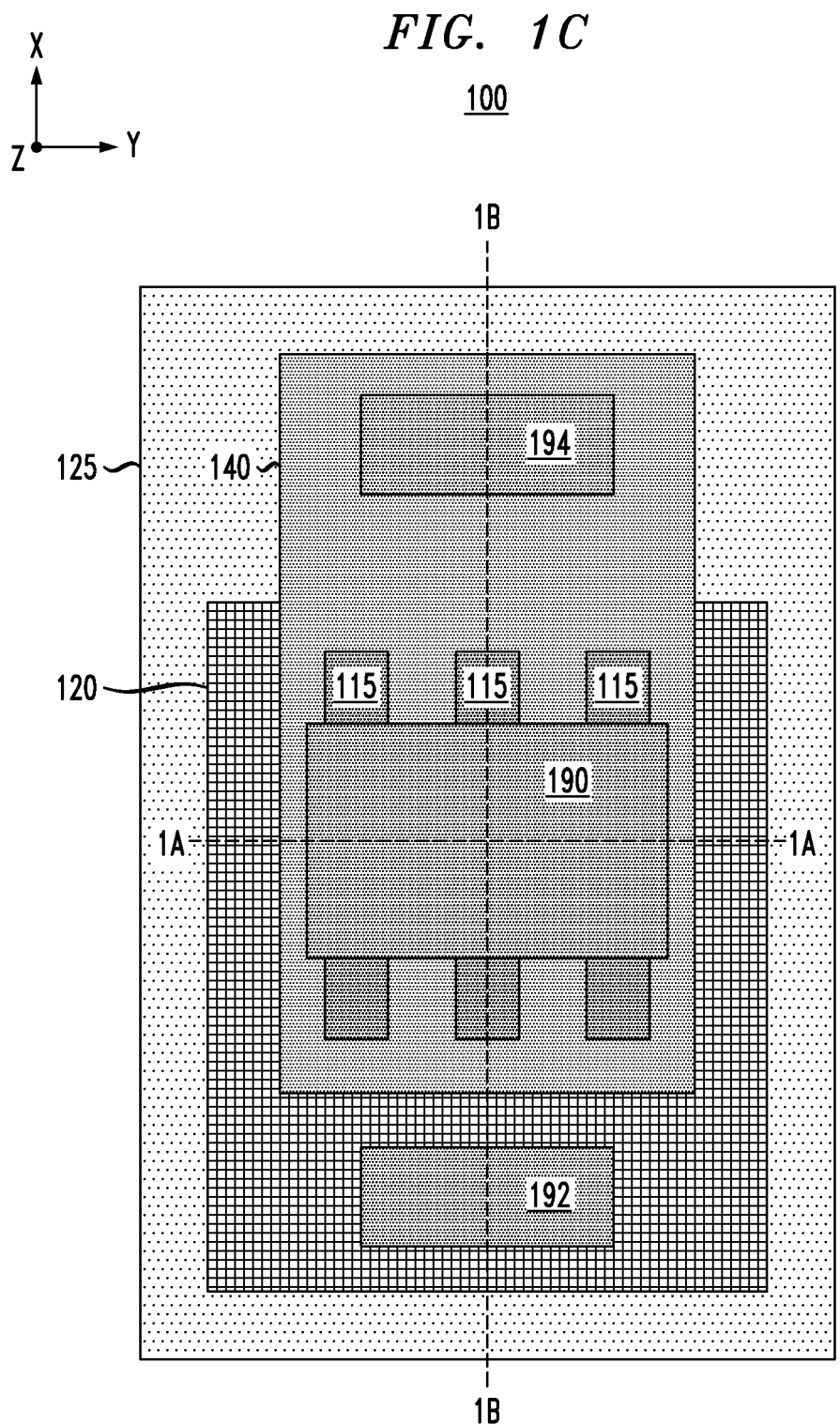

VERTICAL FIELD-EFFECT TRANSISTOR DEVICES WITH NON-UNIFORM THICKNESS BOTTOM SPACERS

TECHNICAL FIELD

This disclosure relates generally to semiconductor fabrication techniques and, in particular, to methods for fabricating vertical field effect transistor (FET) devices.

BACKGROUND

Continued innovations in semiconductor process technologies are enabling higher integration densities and device scaling. As semiconductor manufacturing technologies continue to evolve toward smaller design rules and higher integration densities (e.g., 14/10/7 nm technology nodes and beyond), integrated circuit devices and components become increasingly smaller, creating challenges in layout formation and device performance optimization. Currently, vertical FET technologies are considered to be viable CMOS scaling solutions for FET fabrication at, and below, the 7 nm technology node. The vertical FET technology decouples gate length from the gate pitch requirement, thereby enabling FET density scaling. In general, vertical FET devices are designed to have gate structures that are formed on multiple sides of a vertical channel structure (e.g., a vertical semiconductor fin or vertical nanowire), and with an upper doped source/drain layer formed at the top of the vertical channel structure and a lower doped source/drain layer formed at the bottom of the vertical channel structure.

Various challenges for fabricating vertical FET devices include, for example, the ability to achieve sufficient gate-to-channel control and achieve reduced gate-to-source/drain parasitic capacitance. These challenged are based, in part, on the integration scheme for fabricating bottom spacer structures which serve to electrically insulate the lower source/drain layers from the metal gate structures of the vertical FET devices. If the bottom spacers of a vertical FET are formed too thin, there is an increase in the parasitic capacitance between the metal gate and the lower source/drain layer of the vertical FET. On the other hand, increasing the thickness of the bottom spacers for the purpose of reducing the gate-to-source/drain parasitic capacitance, results in more overlap between the bottom portion of the vertical channel structure (e.g., vertical semiconductor fin) and the bottom spacers, providing a decrease in gate-to-channel control. In addition, a relatively thick bottom spacer adjacent to the bottom portion of a vertical channel structure requires excessive dopant diffusion to form a source/drain extension region, which results in a decrease in junction abruptness between the source/drain extension region and a vertical channel region.

SUMMARY

Embodiments of the invention include device structures and methods for fabricating vertical FET devices with non-uniform thickness bottom spacers to achieve increased device performance. For example, one embodiment includes a method for fabricating a semiconductor integrated circuit device, which comprises: etching a surface of a semiconductor substrate to form a plurality of vertical semiconductor fins of a field-effect transistor device, wherein each vertical semiconductor fin comprises an upper portion with a uniform width, and a bottom portion with concave sidewall surfaces that undercut the upper portion of the vertical semiconductor fin; forming a doped epitaxial source/drain layer on exposed surfaces of the semiconductor substrate and the concave sidewall surfaces of the bottom portions of the vertical semiconductor fins, wherein portions of the doped epitaxial source/drain layer disposed between the vertical semiconductor fins comprise raised curved surfaces; forming a bottom spacer layer on the doped epitaxial source/drain layer, wherein portions of the bottom spacer layer disposed on the portions of the doped epitaxial source/drain layer between the vertical semiconductor fins have a curved-shaped profile with a non-uniform thickness; and performing a thermal anneal process to drive dopants from the doped epitaxial source/drain layer into the bottom portions of the vertical semiconductor fins and thereby form source/drain extension regions, wherein the doped epitaxial source/drain layer and the source/drain extension regions collectively form a bottom source/drain region of the field-effect transistor device.

Another embodiment includes a method for fabricating a semiconductor integrated circuit device, which comprises: etching a surface of a semiconductor substrate to form a plurality of vertical semiconductor fins of a field-effect transistor device, wherein each vertical semiconductor fin comprises an upper portion with a uniform width, and a bottom portion with concave sidewall surfaces that undercut the upper portion of the vertical semiconductor fin; forming a doped epitaxial source/drain layer on exposed surfaces of the semiconductor substrate and the concave sidewall surfaces of the bottom portions of the vertical semiconductor fins, wherein portions of the doped epitaxial source/drain layer disposed between the vertical semiconductor fins comprise raised curved surfaces and oval-shaped cross-sectional profiles; forming a bottom spacer layer on the doped epitaxial source/drain layer, wherein portions of the bottom spacer layer disposed on the portions of the doped epitaxial source/drain layer between the vertical semiconductor fins comprise a crescent-shaped structure which is thickest at a mid-point between the vertical semiconductor fins and which is thinnest at end portions adjacent to bottom regions of the upper portions of the vertical semiconductor fins; forming a metal gate structure over the bottom spacer layer and surrounding the upper portions of the vertical semiconductor fins; performing a thermal anneal process to drive dopants from the doped epitaxial source/drain layer into the bottom portions of the vertical semiconductor fins and thereby form source/drain extension regions with sharp junctions between the source/drain extension regions and channel regions in the upper portions of the vertical semiconductor fins, wherein the doped epitaxial source/drain layer and the source/drain extension regions collectively form a bottom source/drain region of the field-effect transistor device; forming an upper spacer layer on the metal gate structure; and forming upper source/drain layers on top of the upper portions of the vertical semiconductor fins, wherein the upper spacer layer electrically insulates the upper source/drain layers from the metal gate structure.

Another embodiment includes a semiconductor integrated circuit device, which comprises a field-effect transistor device disposed on a semiconductor substrate. The field-effect transistor device comprises: a plurality of vertical semiconductor fins disposed on the semiconductor substrate, wherein each vertical semiconductor fin comprises an upper portion with a uniform width, and a bottom portion with concave sidewall surfaces that undercut the upper portion of the vertical semiconductor fin; a bottom source/drain region disposed around the bottom portions of the vertical semiconductor fins, wherein the bottom source/drain region comprises (i) a doped epitaxial source/drain layer grown on the concave sidewall surfaces of the bottom portions of the vertical semiconductor fins, wherein portions of the doped epitaxial source/drain layer disposed between the vertical semiconductor fins comprise raised curved surfaces, and (ii) source/drain extension regions comprising doped portions of the bottom portions of the vertical semiconductor fins; a bottom spacer layer disposed on the doped epitaxial source/drain layer, wherein portions of the bottom spacer layer disposed on the portions of the doped epitaxial source/drain layer between the vertical semiconductor fins have a curved-shaped profile with a non-uniform thickness; a metal gate structure disposed on the bottom spacer layer and surrounding the upper portions of the vertical semiconductor fins; an upper spacer layer disposed on the metal gate structure; and upper source/drain layers disposed on top of the upper portions of the vertical semiconductor fins, wherein the upper spacer layer electrically insulates the upper source/drain layers from the metal gate structure.

Other embodiments will be described in the following detailed description of embodiments, which is to be read in conjunction with the accompanying figures.

BRIEF DESCRIPTION OF THE DRAWINGS

FIGS. 1A, 1B, and 1C are schematic views of a semiconductor integrated circuit (IC) device comprising a vertical FET device with non-uniform thickness bottom spacers, according to according to an embodiment of the invention, wherein:

FIG. 1A is a schematic cross-sectional side view of the semiconductor IC device along line 1A-1A in FIG. 1C;

FIG. 1B is a schematic cross-sectional side view of the semiconductor IC device along line 1B-1B in FIGS. 1A and 1C; and FIG. 1C is a schematic top plan view of the semiconductor IC device shown in FIGS. 1A and 1B.

FIGS. 2 through 9 schematically illustrate a process for fabricating a semiconductor IC device having vertical FET devices with non-uniform thickness bottom spacers, according to according to an embodiment of the invention, wherein:

FIG. 2 is a schematic cross-sectional view of the semiconductor IC device at an intermediate stage of fabrication in which a plurality of vertical semiconductor fins are formed on a surface of a semiconductor substrate wherein the vertical semiconductor fins have upper portions that are uniform in width, and wider lower portions having with tapered sidewalls;

FIG. 3 is a schematic cross-sectional side view of the semiconductor device shown in FIG. 2 after forming dielectric sidewall spacers on sidewalls of the upper portions of the vertical semiconductor fins;

FIG. 4 is a schematic cross-sectional side view of the semiconductor device shown in FIG. 3 after etching the exposed bottom portions of the vertical semiconductor fins to thin the bottom portions of the vertical semiconductor fins and form concave sidewall surfaces that undercut the upper portions of the vertical semiconductor fins;

FIG. 5 is a schematic cross-sectional side view of the semiconductor device of FIG. 4 after forming a doped epitaxial source/drain layer on exposed surfaces of the semiconductor substrate and the concave sidewall surfaces of the bottom portions of the vertical semiconductor fins, wherein portions of the doped epitaxial source/drain layer disposed between the vertical semiconductor fins comprise raised curved surfaces;

FIG. 6 is a schematic cross-sectional side view of the semiconductor device of FIG. 5 after forming a bottom spacer layer on the doped epitaxial source/drain layer, wherein portions of the bottom spacer layer disposed on the portions of the doped epitaxial source/drain layer between the vertical semiconductor fins have a curved-shaped profile with a non-uniform thickness;

FIG. 7 is a schematic cross-sectional view of the semiconductor device of FIG. 6 after removing the dielectric sidewall spacers from the vertical sidewalls of the upper portions of the vertical semiconductor fins, forming a high-k gate dielectric layer and a metal gate layer of a high-k dielectric/metal gate structure, and after forming a gate encapsulation liner layer over the high-k dielectric/metal gate structure;

FIG. 8 is a schematic cross-sectional side view of the semiconductor device of FIG. 7 after performing a thermal anneal process to form source/drain extension regions; and FIG. 9 is a schematic cross-sectional side view of the semiconductor device of FIG. 8 after forming an interlayer dielectric layer.

DETAILED DESCRIPTION

Figure 1A:
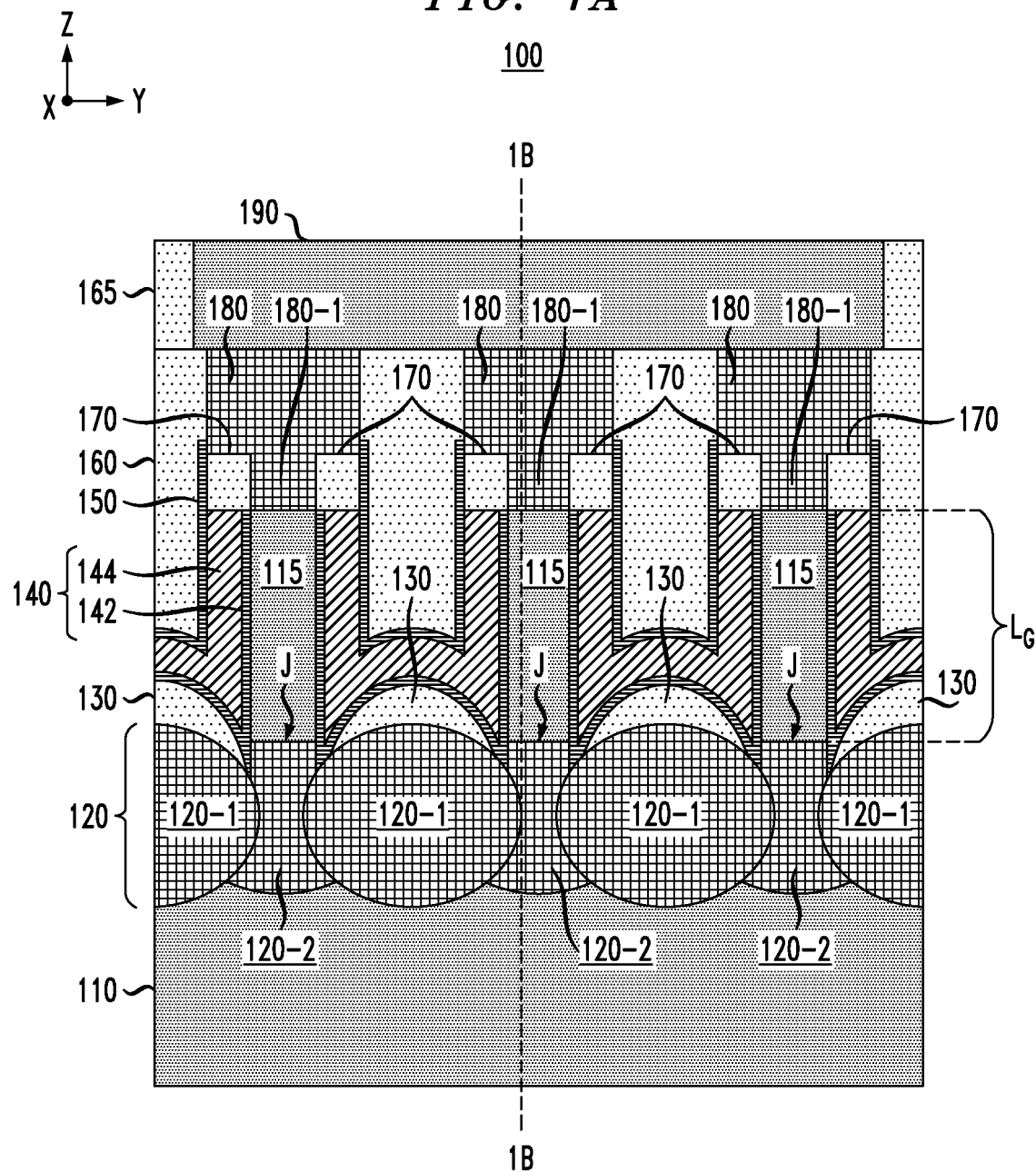

Embodiments of the invention will now be described in further detail with regard device structures and methods for fabricating vertical FET devices with non-uniform thickness bottom spacers that allow for enhanced gate-to-channel control, improved source/drain extension junction abruptness (or junction sharpness), reduced gate-to-source/drain capacitance, and other device performance optimizations. It is to be understood that the various layers, structures, and regions shown in the accompanying drawings are schematic illustrations that are not drawn to scale. In addition, for ease of explanation, one or more layers, structures, and regions of a type commonly used to form semiconductor IC devices or structures may not be explicitly shown in a given drawing. This does not imply that any layers, structures, and regions not explicitly shown are omitted from the actual semiconductor IC device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor IC devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor IC device structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 1B:
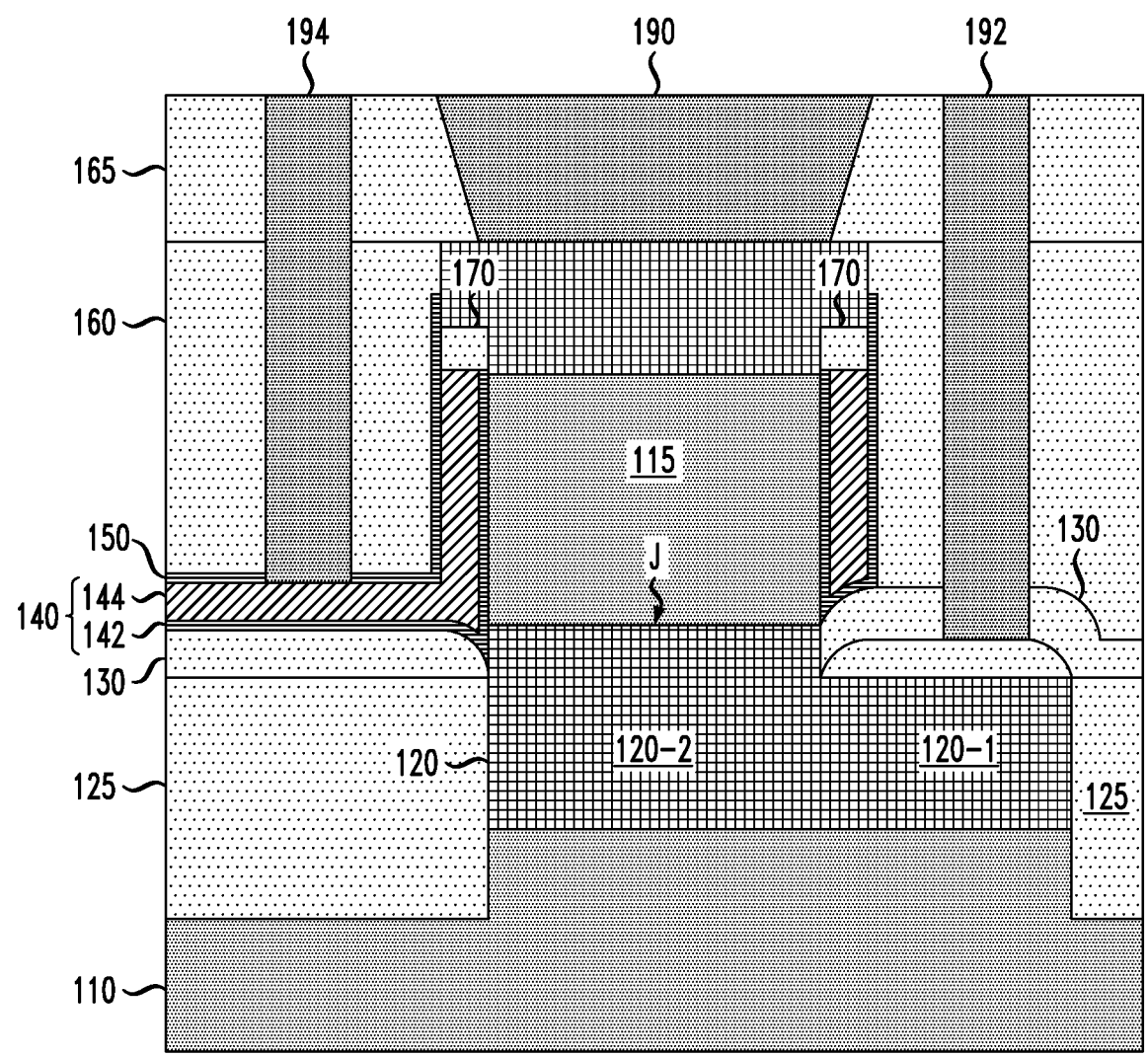

FIGS. 1A, 1B, and 1C are schematic views of a semiconductor integrated circuit (IC) device 100 comprising a vertical FET device with non-uniform thickness bottom spacers, according to according to an embodiment of the invention. FIG. 1C is a schematic top plan view (X-Y plane) of the semiconductor IC device 100, while FIGS. 1A and 1B are cross-sectional side views of the semiconductor IC device 100 along planes that are represented by respective lines shown in FIG. 1C. In particular, FIG. 1A is a schematic cross-sectional side view (Y-Z plane) of the semiconductor IC device 100 along line 1A-1A in FIG. 1C, and FIG. 1B is a schematic cross-sectional side view (X-Z plane) of the semiconductor IC device 100 along line 1B-1B in FIG. 1C. In addition, FIG. 1B is a schematic cross-sectional side view (X-Z plane) of the semiconductor IC device 100 along line 1B-1B in FIG. 1A.

As shown in FIGS. 1A, 1B, and 1C, the semiconductor IC device 100 comprises a semiconductor substrate 110, a plurality of vertical semiconductor fins 115, a bottom source/drain region 120 comprising an epitaxial source/drain layer 120-1 and bottom source/drain extension regions 120-2, a shallow trench isolation (STI) layer 125, a bottom spacer layer 130, a high-k dielectric/metal gate (HKMG) structure 140, a gate encapsulation liner layer 150, a first interlayer dielectric (ILD) layer 160, a second ILD layer 165, top spacers 170, upper epitaxial source/drain layers 180 with upper source/drain extension regions 180-1, vertical source/drain contacts 190 and 192, and a vertical gate contact 194. The HKMG structure 140 comprises a high-k gate dielectric layer 142 and a metal gate layer 144. It is to be understood that the term "source/drain region" or "source/drain layer" as used herein means that a given source/drain region or source/drain layer can be either a source or drain element of the FET device, depending on the application or circuit configuration. It is to be noted that the schematic top plan view of the semiconductor IC device 100 as shown in FIG. 1C is meant to illustrate a footprint area and layout of the vertical semiconductor fins 115, the bottom source/drain region 120, the STI layer 125, the HKMG structure 140, and the vertical contacts 190, 192, and 190, while omitting other elements for ease of illustration.

FIGS. 1A, 1B and 1C schematically illustrate a structure of multi-fin vertical FET device comprising three vertical semiconductor fins 115 which are commonly connected to the bottom source/drain region 120, and have a common HKMG structure 140 which is formed around sidewalls of the vertical semiconductor fins 115. The length portions of the vertical semiconductor fins 115 which are overlapped by the HKMG structure 140 define a gate length LG of the vertical FET device. The vertical source/drain contact 192 extends down through the ILD layers 165 and 160 and the bottom spacer layer 130 to make contact to the bottom source/drain region 120. The vertical source/drain contact 194 extends down through the ILD layers 165 and 160 and the gate encapsulation liner layer 150 to make contact to the HKMG structure 140. The vertical gate contact 190 extends down through the ILD layer 165 and has a large footprint to make contact to each of the upper (top) epitaxial source/drain layers 180 that are formed on the upper portions of the vertical semiconductor fins 115. In this configuration, the vertical semiconductor fins 115 are connected in parallel, providing a multi-fin vertical FET device with a plurality of vertical channel structures (e.g., three vertical semiconductor fins 115) surrounded by the common HKMG structure 140.

FIGS. 1A-1C schematically illustrate an exemplary vertical FET structure in which the epitaxial source/drain layer 120-1 and the bottom spacer layer 130 are designed to achieve enhanced performance and characteristics of the vertical FET device including, for example, enhanced gate-to-channel control, improved source/drain extension junction abruptness (or junction sharpness), reduced gate-to-source/drain capacitance, reduced vertical contact-to-gate capacitance, etc. For example, as shown in FIG. 1A, portions of the epitaxial source/drain layer 120-1 which are disposed between the vertical semiconductor fins 115 have oval-shaped cross-sectional profiles with end portions that laterally extend into undercut regions of the semiconductor substrate 110 below the upper portions of the vertical semiconductor fins 115. The bottom source/drain extension regions 120-2 comprise thinned bottom portions of the vertical semiconductor fins 115 which are doped by driving dopants from the epitaxial source/drain layer 120-1 into the thinned bottom portions of the vertical semiconductor fins 115 by a thermal anneal process to form the bottom source/drain extension regions 120-2. As schematically illustrated in FIG. 1A, the junctions (J) between the bottom source/drain extension regions 120-2 and the upper portions of the vertical semiconductor fins 115 are schematically represented by lines (denoted J) separating the bottom source/drain extension regions 120-2 and the upper portions of the vertical semiconductor fins 115.

Figure 11:
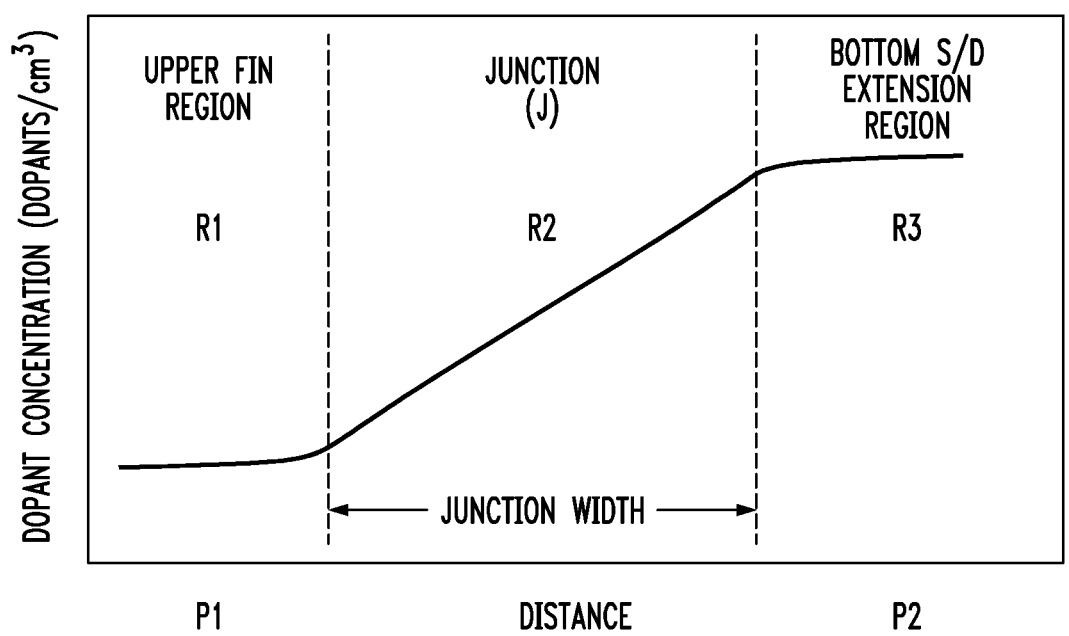
FIG. 11 graphically illustrates an exemplary dopant gradient profile of a junction between an upper portion of a vertical semiconductor fin and a bottom source/drain extension region, according to an exemplary embodiment of the invention.

As is well known to those of ordinary skill in the art, the abruptness (or sharpness) of a junction is defined by dopant gradients. In general, a dopant gradient is the change of doping concentration (dopants/$cm^3$) over a given distance, e.g., the slope of a graph of doping concentration versus distance as graphically illustrated in FIG. 11. In particular, FIG. 11 graphically illustrates an exemplary dopant gradient profile of a junction J between an upper portion of a vertical semiconductor fin 115 and a bottom source/drain extension region 120-2, according to an exemplary embodiment of the invention. FIG. 11 illustrates dopant concentration (Y-axis) over a given distance (X-axis) which starts from a first point P1 within the upper portion of the vertical semiconductor fin 115, traverses the junction J, and ends at a second point P2 within the bottom source/drain extension region 120-2. At the first point P1, the doping concentration is relatively small or 0 and remains relatively constant for a region R1 within the upper portion of the vertical semiconductor fin 115. As the plot moves toward the junction J, a second region R2 is reached where the dopant concentration begins to increase such that a slope is created in the plot. Moving towards point P2, a third region R3 is reached where a higher nominal doping level is achieved within the bottom source/drain extension region 120-2. The slope of the dopant concentration versus distance in region R2 the abruptness (or sharpness) of the junction J. The width of the slope defines the junction width. A steep slope and small width indicates a sharp or abrupt junction. A less steep slope (shallow slope) and larger width indicate a non-abrupt (diffuse) junction. For vertical FET devices, typical slopes for an abrupt junction are in the range of about 0.5 nm per decade (dopant concentration) to about 5 nm per decade (dopant concentration), or any other range in between depending on the dopant type (N-type or P-type) of the vertical FET device. Typical sharp junction widths are about 1 nm to about 5 nm or any other range in between.

In the exemplary vertical FET structure shown in FIG. 1A, the formation of the oval-shaped regions of the doped epitaxial source/drain layer 120-1 adjacent to the thinned bottom portions 115-2 of the vertical semiconductor fins 115 brings the lateral extents of the doped epitaxial material in closer proximity to the bottom regions of the upper portions of the vertical semiconductor fins 115. The closeness in proximity enables the formation of relatively sharp junctions J due the shortened dopant diffusion length that the dopants have to diffuse through semiconductor material of the thinned bottom portions 115-2 of the vertical semiconductor fin 115 to form the bottom source/drain extension regions 120-2 during thermal anneal junction formation process.

In addition, the oval-shaped portions of the doped epitaxial source/drain layer 120-1 have raised, curve-shaped surfaces that facilitate the formation of the bottom spacer layer 130 with non-uniform thickness. In particular, as shown in FIG. 1A, portions of the bottom spacer layer 130 that are disposed between and adjacent to the vertical semiconductor fins 115 have non-planar upper surfaces are non-uniform thickness structures, e.g., crescent-shaped or "quarter-moon-shaped" structures, wherein the portions of the bottom spacer layer 130 between the vertical semiconductor fins 115 have curve shapes with a thicker middle portion that tapers to thinner end portions at the bottom corners of the upper portions of the vertical semiconductor fins 115. As explained in further detail below, the non-uniform thickness of the bottom spacer layer 130 is a result of a directional deposition of oxide material on the curved raised surfaces of the epitaxial source/drain layer 120-1. The non-uniform thickness of the bottom spacer layer 130 provides various advantages with respect to optimizing device performance For example, the formation of the bottom spacer layer 130 with the relatively thin end portions at the bottom corners of the vertical semiconductor fins 115 minimizes the overlap between the end portions of the bottom spacer layer 130 and the channel regions of the vertical semiconductor fins 115. This minimal bottom spacer overlap allows for more uniformity of the overlap between the HKMG structure 140 and the channel regions of the vertical semiconductor fins 115 and, thus, enhanced gate-to-channel control.

In addition, the minimal overlap between the thin end portions of the bottom spacer layer 130 and the bottom portions of the vertical semiconductor fins 115 facilitates the formation of sharp junctions J between the channel regions of the vertical semiconductor fins 115 and the lower source/drain extension regions 120-2. Indeed, the formation of sharp junctions J is a result of the smaller dopant diffusion length and dopant concentration needed to sufficiently dope the bottom portions of the vertical semiconductor fins 115 which are overlapped by the thin end portions of the bottom spacer layer 130 to form sharp junctions J at the bottom locations of the vertical channel regions overlapped by the HKMG structure 140. This is in contrast to conventional vertical FET structures with planar bottom spacers with uniform thickness, wherein the relatively thick end portions of the bottom spacers overlapping the bottom portions of the vertical semiconductor fins would require a longer diffusion path and excessive dopant diffusion to vertically extend the source/drain extension regions into the bottoms of the vertical semiconductor fins, which can degrade junction sharpness and lead to the formation of diffuse junctions J.

Furthermore, the raised portions of the epitaxial source/drain layer 120-1 and the non-uniform thickness profile of the bottom spacer layer 130 collectively allow for a decrease in parasitic capacitances of the vertical FET structure. In particular, while the thin end portions of the bottom spacer layer 130 provide advantages as discussed above, the thicker middle portions of the bottom spacer layer 130 between the vertical semiconductor fins 115 serve to reduce the total effective parasitic capacitance between the HKMG structure 140 and the lower source/drain region 120. In addition, the raised surfaces of the epitaxial source/drain layer 120-1 allows the vertical source/drain contact 192 to be formed with a shorter length and, thus, less overlap between the vertical source/drain contact 192 and the HKMG structure 140, which leads to reduction in the parasitic capacitance between the vertical source/drain contact 192 and the HKMG structure 140.

Figure 2:
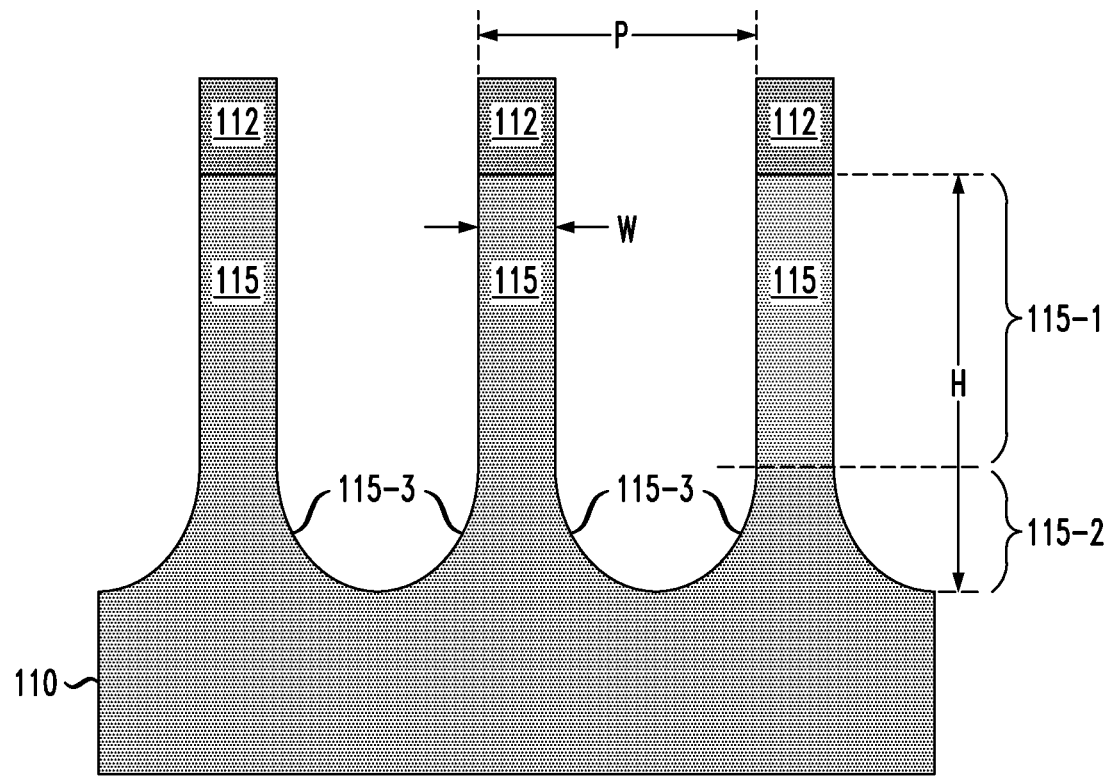

FIGS. 2 through 9 schematically illustrate a process for fabricating a semiconductor IC device having vertical FET devices with non-uniform thickness bottom spacers, according to according to an embodiment of the invention. In particular, for purposes of illustration, FIGS. 2 through 9 schematically illustrate process for fabricating the semiconductor IC device 100 of FIGS. 1A-1C. To begin, FIG. 2 is a schematic cross-sectional view of the semiconductor IC device 100 at an intermediate stage of fabrication in which a plurality of vertical semiconductor fins 115 are formed on a surface of a semiconductor substrate 110. Each vertical semiconductor fin 115 has a hardmask layer 112 covering a top surface of the vertical semiconductor fin 115. The vertical semiconductor fins 115 have upper portions 115-1 that are uniform in width W, and wider lower portions 115-2 with tapered sidewalls 115-3. In some embodiments, the vertical semiconductor fins 115 have a horizontal width W in a range of about 8 nm to about 15 nm, a height H in a range of about 80 nm-100 nm, and a pitch P in a range of about 30 nm to about 50 nm between adjacent fins. The vertical semiconductor fins 115 can have a length (in the X-direction) in a range of about 40 nm to about 200 nm. The hardmask layers 112 can have a thickness of about 10 nm or more. The intermediate device structure shown in FIG. 2 can be fabricated using known methods and materials.

For example, while the semiconductor substrate 110 is illustrated as a generic substrate layer, the semiconductor substrate 110 may comprise various structures and layers of semiconductor material. In some embodiments, the semiconductor substrate 110 is a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In other embodiments, the semiconductor substrate 110 is an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure. It is to be noted that in each drawing, the X-Y plane represents a plane that is parallel to the plane of the semiconductor substrate 110 (e.g., wafer) being processed.

In some embodiments, the vertical semiconductor fins 115 are patterned from a crystalline Si or SiGe layer that is epitaxially grown on top of a bulk silicon substrate or a bulk germanium substrate. A crystalline SiGe layer that is formed using an epitaxial growth process may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on a silicon substrate layer. A strained-Si/relaxed-SiGe structure provides a tensile strain which primarily improves electron mobility for n-type FET devices, while a strained-SiGe/relaxed-Si structure provides a compressive strain which primarily improves hole mobility for p-type FET devices.

The vertical semiconductor fins 115 can be fabricated using various methods. For example, for bulk and SOI substrate embodiments, the vertical semiconductor fins 115 can be formed by depositing a layer of hardmask material (e.g., silicon nitride layer) on the upper surface of the semiconductor substrate 110 and patterning the layer of hardmask material to form an etch mask comprising the hardmask layers 112 which define an image of the pattern of vertical semiconductor fins 115 to be etched in the upper surface of the semiconductor substrate 110. The hardmask layers 112 are used as an etch mask to etch the upper surface of the semiconductor substrate 110 using an anisotropic dry etch process to form a pattern of vertical semiconductor fins in different device regions across the semiconductor wafer, three of which are shown in FIG. 2 for ease of illustration. The etch parameters for the RIE are tuned to so that the RIE process results in the formation of the vertical semiconductor fins 115 with widening bottom portions 115-2 defined by the tapered sidewalls 115-3. In some embodiments, the surface profile of the semiconductor substrate 110 between the bottom portions 115-2 of the vertical semiconductor fins 115 is semi-oval-shaped, wherein the tapered sidewalls 115-3 are defined by the semi-oval-shaped surface profile.

Figure 3:
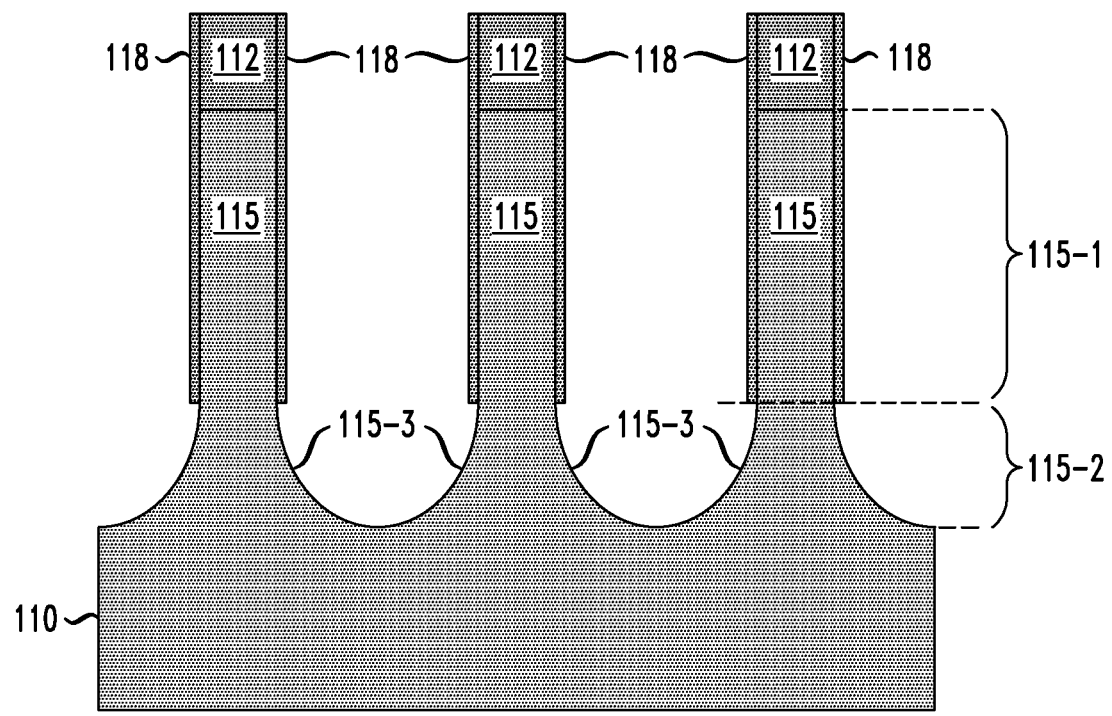

Next, FIG. 3 is a schematic cross-sectional side view of the semiconductor device shown in FIG. 2 after forming dielectric sidewall spacers 118 on sidewalls of the vertical semiconductor fins 115. More specifically, the dielectric sidewall spacers 118 are formed to cover the sidewalls of the hardmask layers 112 and the upper portions 115-1 of the vertical semiconductor fins 115 which are uniform in width W. In some embodiments, the dielectric spacers 118 are formed of silicon nitride. The dielectric spacers 118 are formed by a process which comprises depositing a conformal layer of dielectric material (e.g. silicon nitride) over the surface of the intermediate device structure shown in FIG. 2. The conformal layer of dielectric material can be deposited using plasma-enhanced chemical vapor deposition (PECVD), atomic layer deposition (ALD), or other suitable deposition methods which enable the deposition of thin films of dielectric material with high conformality. The conformal layer of dielectric material is then patterned using a directional dry etch process (e.g., RIE) to remove the portions of the conformal layer of dielectric material on the horizontal and tapered surfaces, while leaving the portion of the conformal dielectric material on the vertical surfaces, resulting the intermediate device structure shown in FIG. 3.

Figure 4:
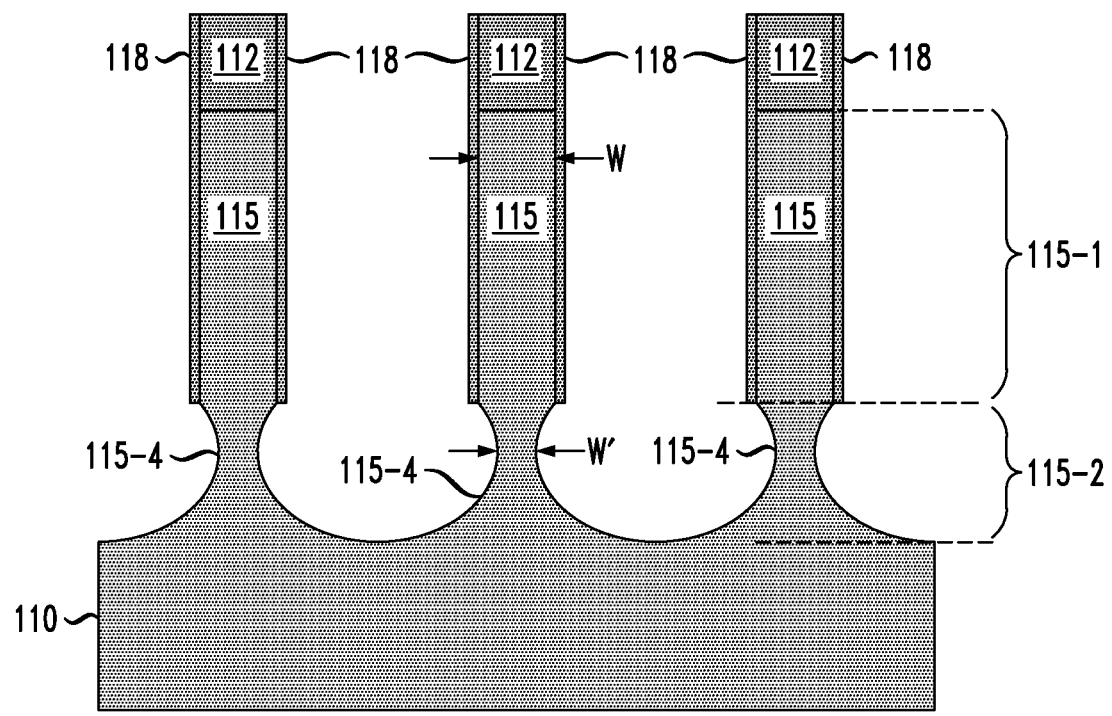

Next, FIG. 4 is a schematic cross-sectional side view of the semiconductor device shown in FIG. 3 after etching the exposed bottom portions 115-2 of the vertical semiconductor fins 115 to thin the bottom portions 115-2 of the vertical semiconductor fins 115 and form concave sidewall surfaces 115-4 that undercut the upper portions 115-1 of the vertical semiconductor fins 115. In one embodiment, an isotropic etch process (e.g., wet or dry) is performed to etch the semiconductor material of the exposed surfaces of the substrate 110 and the vertical semiconductor fins 115 (e.g., tapered sidewalls 115-3) selective to the materials of the hardmask layers 112 and the sidewall spacers 118 to thin the bottom portions 115-2 of the vertical semiconductor fins 115-2 to a target width W' which is less than the width W of the upper portions 115-1 of the vertical semiconductor fins 115. As schematically illustrated in FIG. 4, the isotropic etch process results in the bottom portions 115-2 of the vertical semiconductor fins 115 having reduced width profiles defined by concave sidewall surfaces 115-4 (e.g., semi-oval-shaped surfaces 115-4) which undercut the upper portions 115-1 of the vertical semiconductor fins 115. The dielectric sidewall spacers 118 prevent the etching of the upper portions 115-1 of the vertical semiconductor fins 115 during the isotropic etch process to thin the bottom portions 115-2 of the vertical semiconductor fins 115.

Figure 10:
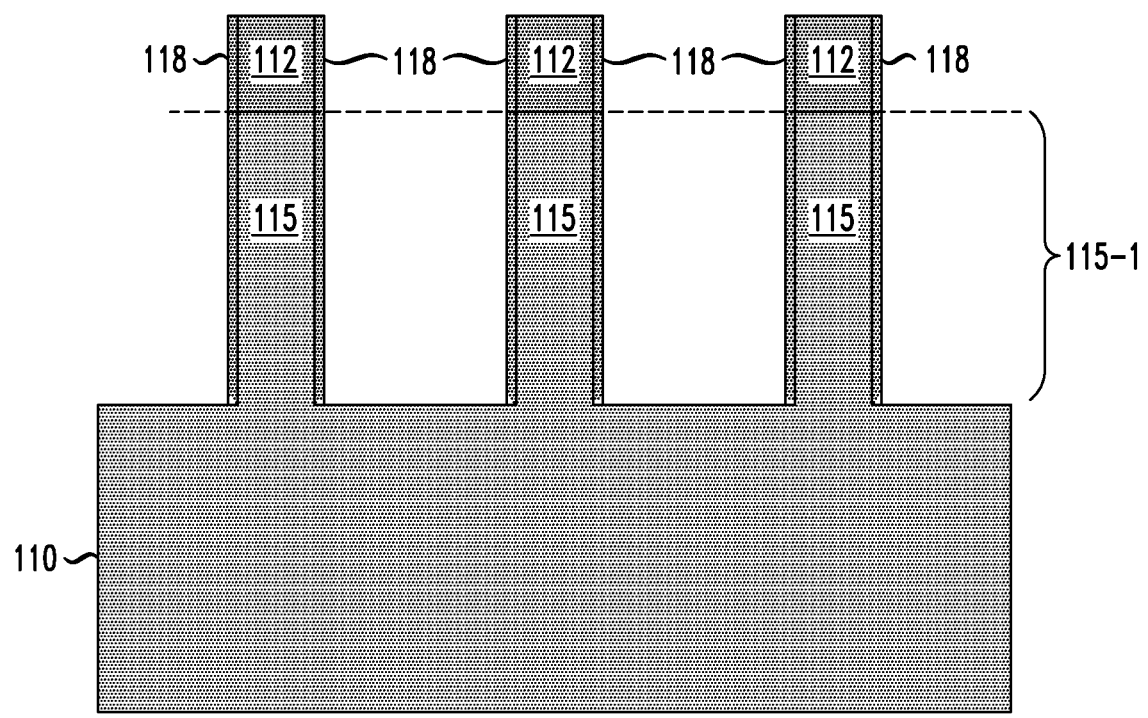
FIG. 10 is a schematic cross-sectional view of a semiconductor IC device at an intermediate stage of fabrication in which a plurality of vertical semiconductor fins are formed on a surface of a semiconductor substrate wherein the vertical semiconductor fins are uniform in width, and after forming dielectric sidewall spacers on sidewalls of the vertical semiconductor fins.

The intermediate device structure shown in FIG. 4 can be fabricated using other techniques. For example, FIG. 10 is a schematic cross-sectional side view of the semiconductor at an initial stage of fabrication after patterning the semiconductor substrate 110 to initially form the upper portions 115-1 of the vertical semiconductor fins 115 having uniform width, and forming dielectric sidewall spacers 118 on sidewalls of the vertical semiconductor fins 115. In this embodiment, the initial RIE process to etch the substrate 110 and form the vertical semiconductor fins 115 results in planar (flat) recessed surfaces at the bottoms of the vertical semiconductor fins 115. Thereafter, another RIE is performed to etch the recessed surfaces of the semiconductor substrate 110 shown in FIG. 10 to form the tapered bottom portions 115-2 of the vertical semiconductor fins 115 as shown in FIG. 3, which is then followed by another etch to thin the bottom portions 115-2 of the vertical semiconductor fins 115 as shown in FIG. 4.

Figure 5:
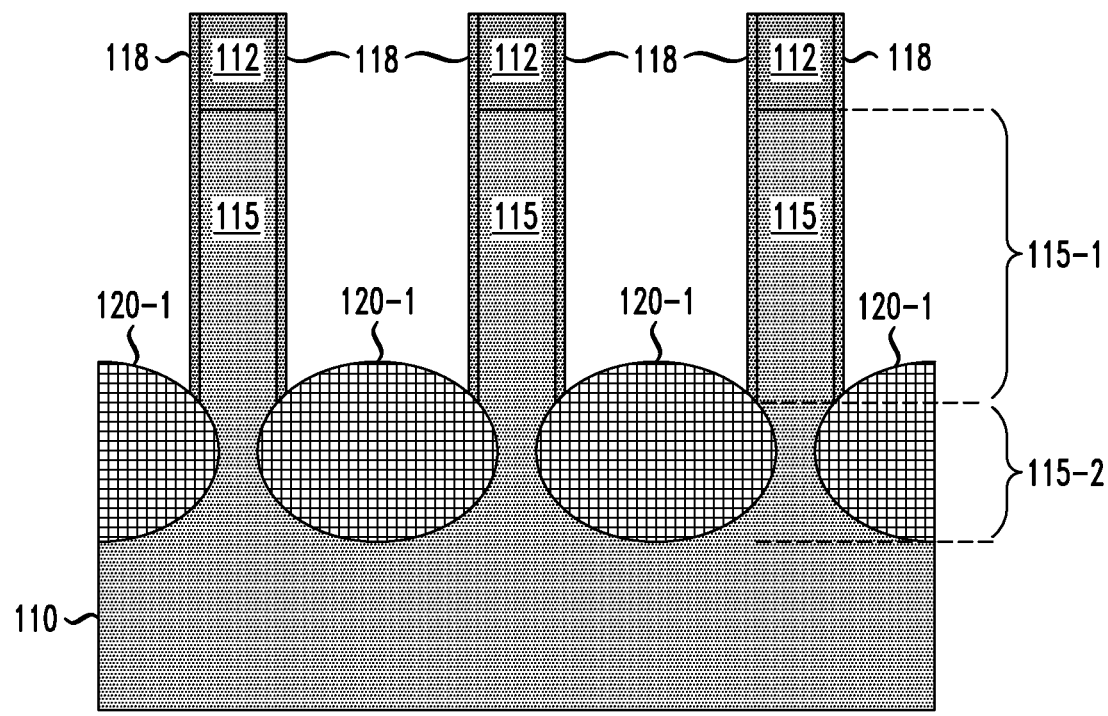

After thinning the bottom portions 115-2 of the vertical semiconductor fins 115 to obtain the intermediate device structure shown in FIG. 4, the process flow continues with growing an epitaxial source/drain layer which forms, in part, the lower source/drain layer region of the vertical FET device (FIGS. 1A-1C). In particular, FIG. 5 is a schematic cross-sectional side view of the semiconductor device of FIG. 4 after forming a doped epitaxial source/drain layer 120-1 on exposed surfaces of the semiconductor substrate 110 and the concave sidewall surfaces 115-4 of the thinned bottom portions 115-2 of the vertical semiconductor fins 115, wherein portions of the doped epitaxial source/drain layer 120-1 disposed between the vertical semiconductor fins 115 comprise raised curved surfaces. The epitaxial source/drain layer 120-1 is formed by epitaxially growing semiconductor material (e.g., epitaxial silicon (Si) material, silicon-germanium (SiGe) material, carbon doped silicon (Si:C) material, phosphorus doped silicon (Si:P) material, phosphorus doped SiGe (SiGe:P) material, boron doped SiGe (SiGe:B) material, etc.) starting on the exposed surfaces of the substrate 110 and the exposed sidewall surfaces 115-4 of the bottom portions 115-2 of the vertical semiconductor fins 115 using known techniques such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metal organic molecular beam epitaxy), or other known epitaxial growth techniques. The type of epitaxial material and doping used to form the doped epitaxial source/drain layer 120-1 will vary depending on whether the vertical FET devices is a P-type or N-type FET device. The dielectric sidewall spacers 118 prevent the formation of epitaxial material on the upper portions 115-1 of the vertical semiconductor fins 115 during the epitaxy process.

In addition, the epitaxial source/drain layer 120-1 is doped using known techniques. For example, in one embodiment, the epitaxial source/drain layer 120-1 is "in-situ" doped during epitaxial growth by adding a dopant gas to the source deposition gas. Exemplary dopant gases may include a boron (B) containing gas such as $BH_3$ for P-type FET devices or a phosphorus (P) or arsenic (As) containing gas such as $PH_3$ or $AsH_3$ for N-type FET devices, wherein the concentration of impurity in the gas phase determines its concentration in the epitaxially grown semiconductor material. The use of an in-situ doping process is merely an example. For instance, an ex-situ process may be used to introduce dopants into the source/drain layers. Other doping techniques can be used to incorporate dopants in the source/drain layers. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques.

As schematically illustrated in FIG. 5, the portions of the epitaxial source/drain layer 120-1 that are formed adjacent to the vertical semiconductor fins 115 have non-planar upper surfaces (e.g., curved surfaces) with a non-uniform thickness relative to the upper portions 115-1 of the vertical semiconductor fins 115. For example, as schematically illustrated in FIG. 5, the portions of the epitaxial source/drain layer 120-1 that are disposed between and adjacent to the vertical semiconductor fins 115 are oval-shaped portions having raised curve-shaped surfaces which are thicker at the mid-points between adjacent vertical semiconductor fins 115 and vertically extend to a level that is higher that the bottoms of the upper portions 115-1 of the vertical semiconductor fins 115. In addition, the thinned profile of the bottom portions 115-2 of the vertical semiconductor fins 115 allows the lateral extents of the epitaxial material of the portions of the source/drain layer 120-1 to extend into the undercut regions below the upper portions 115-1 of the vertical semiconductor fins 115. This structural configuration facilitates the formation of the source/drain extension regions 120-2 at a later stage of fabrication (due to shorter diffusion length) wherein a thermal anneal process is performed to cause dopants from the epitaxial source/drain layer 120-1 to diffuse into the bottom portions 115-2 of the vertical semiconductor fins 115 and form the source/drain extension regions 120-2.

Following the formation of the doped epitaxial source/drain layer 120-1, the STI layer 125 shown in FIGS. 1B and 1C is formed using known materials and fabrication techniques. For example, a block mask is formed to cover the vertical semiconductor fins 115 and the area of the deposited epitaxial source/drain layer 120-1, which defines the footprint area of the bottom source/drain region 120. One or more anisotropic dry etch processes (e.g., RIE) are then performed to each away the exposed portions of the epitaxial material and etch trenches into the semiconductor substrate to a target depth below the bottom level of the epitaxial source/drain layer 120-1. The trenches are then filled with insulating/dielectric material to form the STI layer 125. The insulating/dielectric material may include, for example, a conformal SiN liner that is deposited initially to line the sidewalls and bottom surface of the trenches, followed by a blanket deposition of an oxide material (e.g., $SiO_2$ or silicon oxynitride (SiON)) to fill the trenches. The overburden (excess) insulating/dielectric material is then removed by planarizing (via chemical-mechanical planarization (CMP)) the overburden material down to the top of the hardmask layers 112, and then further recessed down to a target level using an etch-back process (e.g., selective RIE process) to form the STI layer 125.

Figure 6:
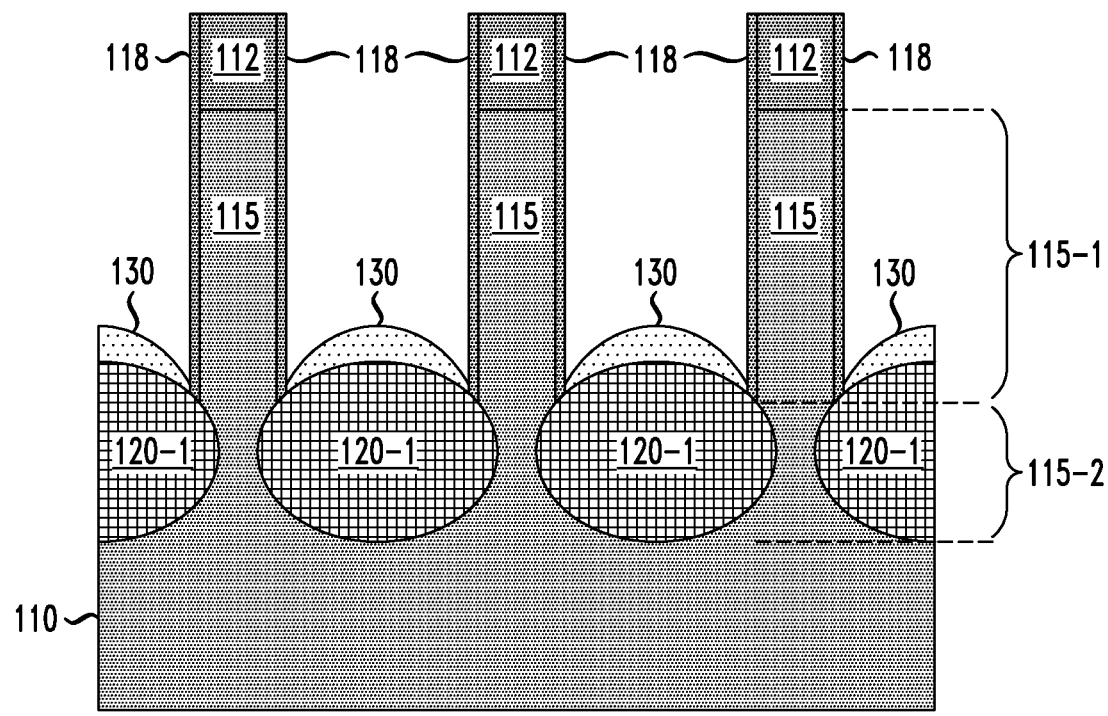

Next, FIG. 6 is a schematic cross-sectional side view of the semiconductor device of FIG. 5 after forming a bottom spacer layer 130 on the doped epitaxial source/drain layer 120-1, wherein portions of the bottom spacer layer 130 disposed on the portions of the doped epitaxial source/drain layer 120-1 between the vertical semiconductor fins 115 have a curved-shaped profile with a non-uniform thickness. In some embodiments, the bottom spacer layer 130 is formed by depositing an oxide material using a high density plasma (HDP) chemical vapor deposition (CVD) process (HDPCVD), wherein the oxide material comprises a low-k insulating oxide material such as silicon dioxide, silicon oxynitride, etc. In other embodiments, the bottom spacer layer 130 can be formed of HDP silicon nitride, or other suitable materials. In one embodiment, the parameters of the HDP deposition are tuned to achieve a directional deposition of oxide or nitride material wherein the deposition rate of the oxide or nitride material on horizontal surfaces is greater than the deposition rate of oxide or nitride material on vertical surfaces. An etch back process is performed to remove oxide or nitride material on the vertical surfaces, resulting in the semiconductor structure shown in FIG. 6. By way of example only, a HDPCVD or physical vapor deposition (PVD) process can be used for directional film deposition, and an oxide-selective or nitride-selective (depending on the spacer material) isotropic etch can be used to remove the (thinner) spacer material that is deposited on the vertical surfaces.

As schematically illustrated in FIG. 6, the portions of the bottom spacer layer 130 that are formed between and adjacent to the vertical semiconductor fins 115 have non-planar upper surfaces (e.g., curved surfaces) with a non-uniform thickness relative to the upper portions 115-1 of the vertical semiconductor fins 115. As an exemplary description, as noted above, the portions of the bottom spacer layer 130 schematically shown in FIG. 6 are crescent-shaped or quarter-moon-shaped wherein the end portions of the bottom spacer layer 130 at the bottom corners of the upper portions 115-1 of the vertical semiconductor fins 115 are thin, while the mid-portions of the bottom spacer layer 130 at the mid-points between adjacent vertical semiconductor fins 115 are thick. The non-uniform thickness of the portions of the bottom spacer layer 130 between the vertical semiconductor fins 115 is a result of the directional deposition of the oxide material on the curved surfaces of the epitaxial source/drain layer 120-1, wherein the deposition rate of the oxide material on the surfaces of the epitaxial source/drain layer 120-1 with a more lateral/horizontal topography (e.g., mid-points between the semiconductor fins 115) is greater than the deposition rate of the oxide material on the surfaces of the epitaxial source/drain layer 120-1 with a more vertical topography (e.g., end portions at bottom corners of the semiconductor fins 115).

Figure 7:
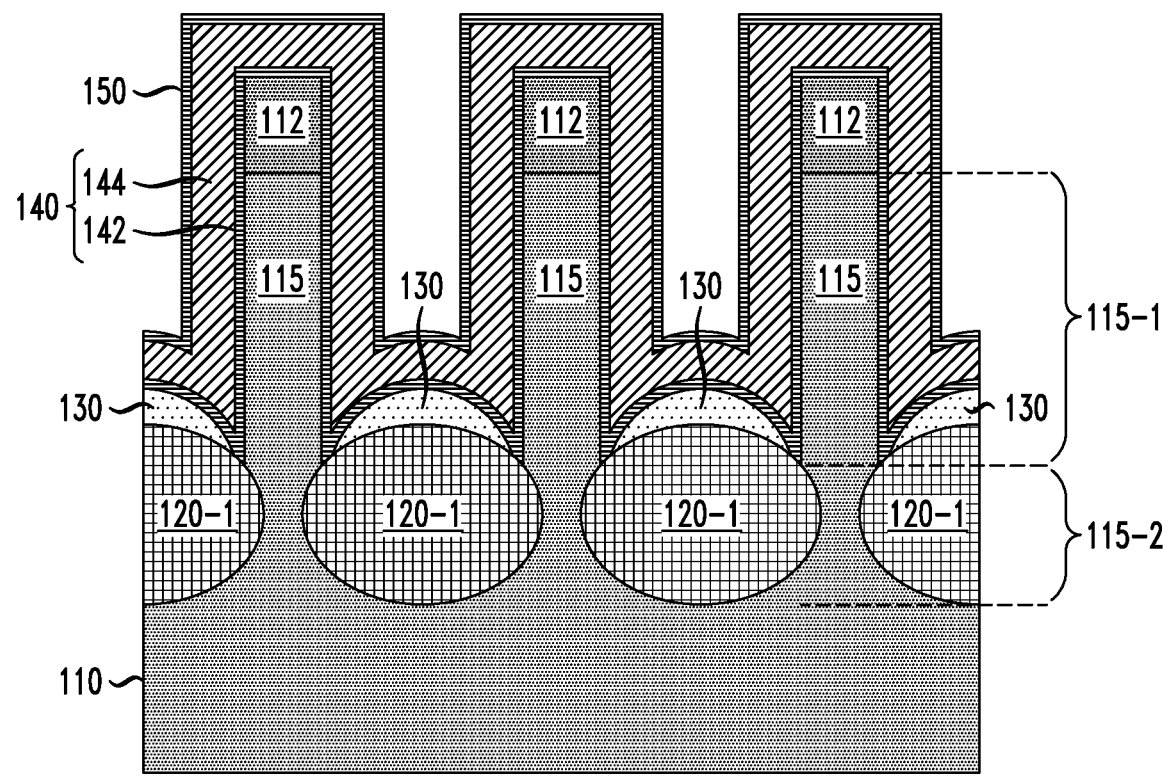

A next stage of the fabrication process comprises forming the HKMG structure 140 for the vertical FET device. For example, FIG. 7 is a schematic cross-sectional view of the semiconductor device of FIG. 6 after removing the dielectric sidewall spacers 118 from the vertical sidewalls of the semiconductor fins 115, after forming a high-k gate dielectric layer 142 and a metal gate layer 144 of the HKMG structure 140, and after forming a gate encapsulation liner layer 150 to cover the HKMG structure 140. The dielectric sidewall spacers 118 are removed using any suitable etch process and etch chemistry that is configured to etch the dielectric material of the sidewall spacers 118 selective to the materials that form the vertical semiconductor fins 115 and the bottom spacer layer 130.

The high-k gate dielectric layer 142 is formed by depositing one or more conformal layers of high-k gate dielectric material to conformally cover the surface topography of the semiconductor device. The conformal layer(s) of high-k dielectric material can be formed of any suitable dielectric having a dielectric constant (k) of about 3.9 or greater. For example, the gate dielectric material can include, but is not limited to, metal oxides such as hafnium oxide, hafnium silicon oxide, hafnium silicon oxynitride, hafnium zirconium oxide, and nitrided films thereof. In other embodiments, the high-k dielectric may comprise lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal gate dielectric layer is formed with a thickness in a range of about 0.5 nm to about 2.0 nm, which will vary depending on the target application. The conformal high-k gate dielectric layer 142 is deposited using known methods such as ALD, for example, which allows for high conformality of the gate dielectric material.

In some embodiments, the metal gate layer 144 is formed by depositing one or more conformal work function metal (WFM) layers over the conformal high-k gate dielectric layer 142. In one embodiment, a total thickness of the conformal WFM material is in a range of 2 nm to about 5 nm. The WFM layers are used to obtain target work functions which are suitable for the type (e.g., N-type or O-type) of vertical FET device to be formed and, thus, allow for tuning of the threshold voltage of the vertical FET device. For example, the WFM layers can include titanium nitride (TiN), and an aluminum (Al) containing alloy material such as titanium aluminum carbide (TiAlC), TiAl, AlC, etc. In other embodiments, the WFM layer may include, e.g., TaN, Zr, W, Hf, Ti, Al, Ru, Pa, ZrAl, WAl, TaAl, HfAl, TiAlC, TaC, TiC, TaMgC, or other types, compositions, or alloys of work function metals that are commonly used to obtain target work functions for threshold voltage tuning. The WFM layers are deposited using known methods such as ALD or molecular layer deposition (MLD), for example, which allows for high conformality of the gate dielectric material.

Furthermore, in some embodiments, the metal gate layer 144 includes a conformal layer of lower-resistance metallic material that is formed over the WFM layers to reduce a total effective resistance of the metal gate layer 144. For example, the low-resistance metallic material can be tungsten, titanium, tantalum, cobalt, ruthenium, zirconium, copper, aluminum, platinum, tin, silver, etc. The metal gate layer 144 may further comprise dopants that are incorporated during or after deposition. The layer of conductive material is deposited using a suitable deposition process, for example, CVD, PECVD, PVD, plating, thermal or e-beam evaporation, sputtering, etc.

The gate encapsulation liner layer 150 is conformally deposited over the metal layer gate layer 144 to protect and electrically insulate the HKMG structure 140 of the vertical FET device from surrounding elements. For example, the gate encapsulation liner layer 150 serves as a diffusion barrier between the metal gate layer 144 and a surrounding ILD layer that is formed in a subsequent stage of fabrication. In some embodiments, the gate encapsulating liner layer 150 is formed of silicon nitride. In other embodiments, the gate encapsulation liner layer 150 is formed of SiBCN, SiCON, or any other type of low-k dielectric material that is commonly used to form insulating gate sidewall spacers of FET devices. The gate encapsulation liner layer 150 is formed using known deposition techniques such as ALD, CVD, PVD, etc., which are tuned to achieve high conformality of the gate encapsulation liner layer 150.

Figure 8:
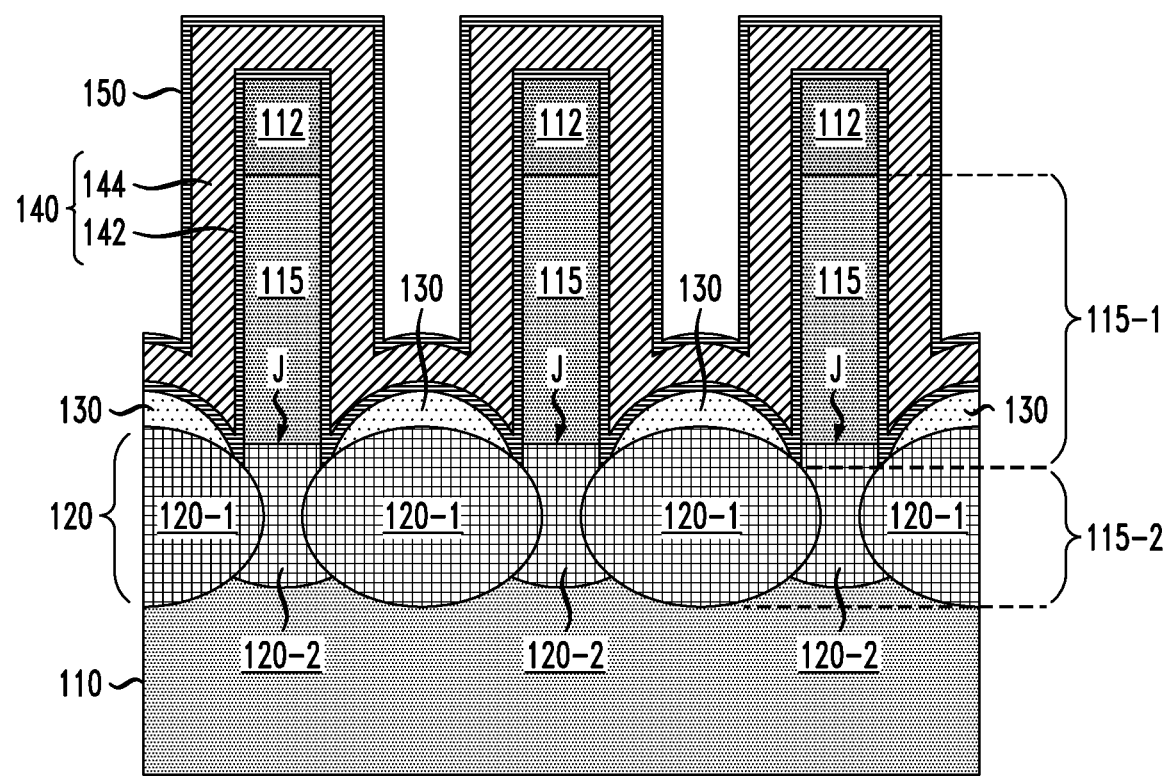

Next, FIG. 8 is a schematic cross-sectional side view of the semiconductor device of FIG. 7 after performing a thermal anneal process to form the source/drain extension regions 120-2. The thermal anneal process serves to drive dopants from the doped epitaxial source/drain layer 120-1 into the bottom portions 115-2 of the vertical semiconductor fins 115, as well as drive dopants into bottom regions of the upper portions 115-1 of the vertical semiconductor fins 115 and form abrupt junctions J between the source/drain extension regions 120-2 and the channel regions of the vertical semiconductor fins 115. In this regard, the source/drain extension regions 120-2 that are formed as a result of the thermal anneal process effectively serve to extend the epitaxial source/drain layer 120-1 into the thinned bottom portions 115-2 of the vertical semiconductor fins 115 and collectively form the lower source/drain region 120. The thermal anneal process also serves to improve the reliability of the high-k gate dielectric layer 142.

As noted above, the thinned bottom portions 115-2 of the vertical semiconductor fins 115 facilitate the formation of the source/drain extension regions 120-2 due to the short diffusion length that dopants must travel from the portions of the doped epitaxial material of the source/drain layer 120-1, which extend into the undercut regions below the upper portions 115-1 of the vertical semiconductor fins 115, into the semiconductor material at the bottom regions of the vertical semiconductor fins 115. In addition, the minimal overlap between the thin end portions of the bottom spacer layer 130 and the bottom regions of the upper portions 115-1 of the vertical semiconductor fins 115 facilitates the formation of sharp junctions J between the channel regions of the vertical semiconductor fins 115 (regions overlapped by the HKMG structure 140) and the lower source/drain extension regions 120-2. Indeed, the formation of sharp junctions J is a result of the smaller dopant diffusion length and dopant concentration needed to sufficiently extend the doping of the semiconductor material into the bottom regions of the upper portions 115-1 of the vertical semiconductor fins 115 and form sharp junctions J at the interface between the source/drain extension regions 120-2 and the vertical channel regions of the vertical semiconductor fins 115 overlapped by the HKMG structure 140.

Figure 9:
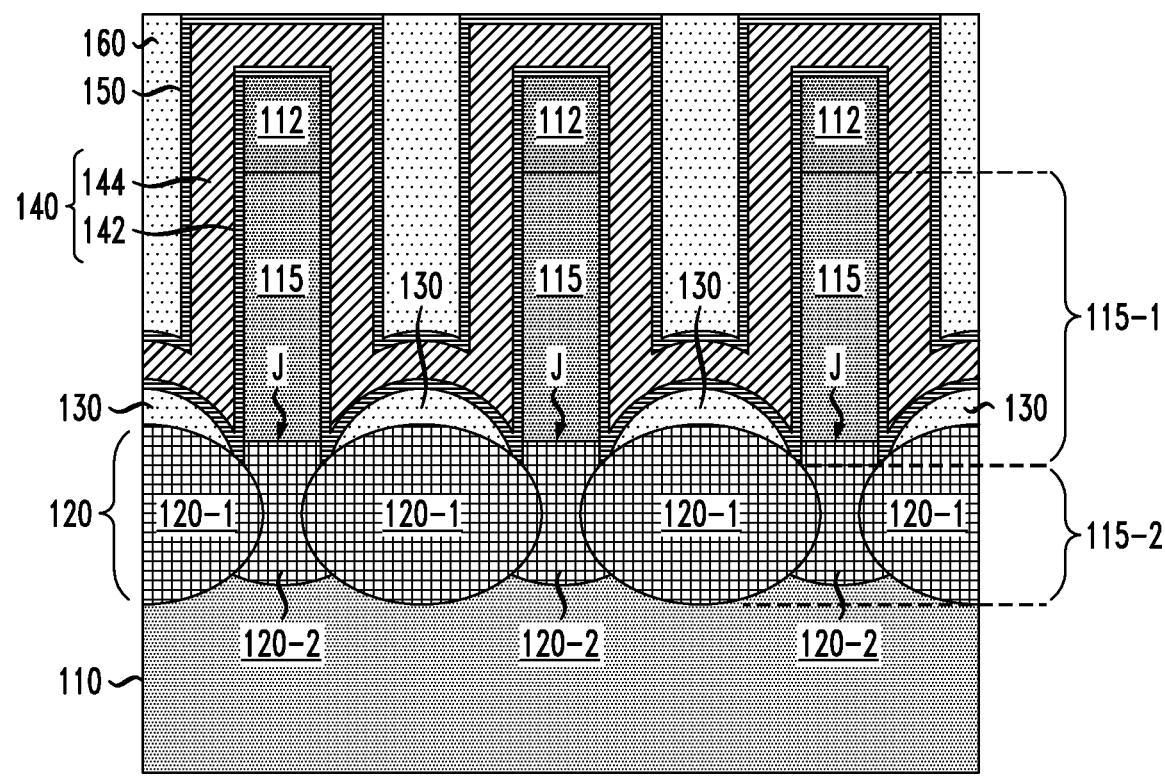

Next, FIG. 9 is a schematic cross-sectional side view of the semiconductor device of FIG. 8 after forming the ILD layer 160. The ILD layer 160 is formed by depositing a layer of dielectric material and performing a CMP process to remove the overburden dielectric material and planarize the ILD layer 160 down to the gate encapsulating liner layer 150. The ILD layer 160 may comprise any suitable insulating/dielectric material that is commonly utilized to form front-end-of-line ILD layers including, but not limited to, silicon oxide, silicon nitride, silicon oxynitride, carbon-doped silicon glass (SiCOH) or organosilicate glass (SOG)), a fluorinated silicon glass (FSG), or other types of silicon-based low-k dielectrics (e.g., k less than about 4.0), porous dielectrics, known ULK (ultra-low-k) dielectric materials (with k less than about 2.5), or any suitable combination of those materials. The ILD layer 160 is deposited using known deposition techniques, such as, for example, ALD, CVD, PECVD, PVD, or spin-on deposition.

Prior to forming the ILD layer 160, a gate cut process can be performed to pattern the gate dielectric layer 142 and metal gate layer 144 to define the HKMG structure 140 of the vertical FET device. For example, a gate cut process comprises forming a block mask to cover the portions of the gate dielectric layer 142 and the metal gate layer 144 which define the footprint of the HKMG structure 140, and then utilizing the block mask to anisotropically etch away exposed portions of the gate dielectric layer 142 and the metal gate layer 144 outside the field region of the vertical FET device down to the bottom spacer layer 130 or down to the STI layer 125. In one embodiment, the block mask is formed by depositing a layer of mask material (e.g., photoresist material, or organic planarizing layer (OPL) material), and patterning the layer of mask material to form a block mask with an image that defines the footprint of the HKMG structure 140 of the vertical FET device (e.g., as shown in FIG. 1C). The gate cut process is performed, for example, using a RIE process to etch down the exposed portions of the gate dielectric layer 142 and the metal gate layer 144.

Following the formation of the ILD layer 160 in FIG. 9, any known sequence of processing steps can be performed to continue the fabrication of the semiconductor IC circuit device 100 shown in FIGS. 1A, 1B and 1C. Briefly, starting from the structure shown in FIG. 9, the exposed upper portions of the gate encapsulation liner layer 150 are removed to expose the metal gate layer 144. A gate recess process is performed to recess the upper surfaces of the metal gate layer 144 and the gate dielectric layer 142 down to a target level (below the hardmask layers 112) which defines a gate length LG (see FIG. 1A) of the vertical FET device. The gate recess process is performed using, for example, an RIE process having an etch chemistry which is suitable to etch the conductive and insulating materials of the layers 142 and 144 selective to the nitride materials of the gate encapsulation liner layer 150 and the hardmask layers 112.

The top spacers 170 are formed by depositing a layer of insulating material such as silicon oxide, silicon nitride, or some other type of low-k dielectric material that is commonly used to form insulating top spacers for vertical FET devices. The top spacers 170 can be fabricated using deposition and patterning methods well known to those of ordinary skill in the art, details of which are not necessary for understanding the exemplary embodiments discussed herein.

An etch process is performed to vertically etch down the exposed portions of the gate encapsulation liner layer 150 and the hardmask layers 112 to expose the upper surfaces of the vertical semiconductor fins 115 on which the upper source/drain layers 180 are epitaxially grown. The gate encapsulation liner layer 150 and the hardmask layers 112 can be removed using any suitable dry or wet etch process with an etch chemistry that is configured to etch the materials of the liner layer 150 and hardmask layer 112 selective to the materials of the first ILD layer 160, the top spacers 170, and the vertical semiconductor fins 115.

Following removal of the hardmask layers 112, the upper source/drain layers 180 are epitaxially grown on the exposed upper portions of the vertical semiconductor fins 115. In one embodiment, the upper source/drain layers 180 are formed by epitaxially growing doped semiconductor layers (e.g., doped Si, doped SiGe, etc.) on the exposed upper portions of the vertical semiconductor fins 115 using known selective growth techniques in which the epitaxial material is not grown on the exposed surface of the first ILD layer 160 and the top spacers 170. The type of epitaxial semiconductor material that is used to form the upper source/drain layers 180 will vary depending on various factors including, but are not limited to, the type of material of the vertical semiconductor fins 115 and the device type (e.g., P-type or N-type) of the vertical FET device to be formed. In some embodiments, the upper source/drain layers 180 are doped in-situ or ex-situ, using the same or similar dopants and doping techniques as discussed above for doping the lower epitaxial source/drain layer 120-1. Following the formation the upper source/drain layers 180, a thermal anneal process is performed to drive dopants into the upper surface of the vertical semiconductor fins 115 and form the upper source/drain extension regions 180-1.

Following formation the upper source/drain layers 180, a MOL (middle of the line) process is performed to form the second ILD layer 165, form contact openings (e.g. trenches) in the ILD layers 165 and 160, and fill the contact openings with conductive material to form the vertical source/drain contacts 190 and 192, and the vertical gate contact 194. The second ILD layer 165 is formed by depositing and planarizing a layer of insulating material which is the same or similar to the insulating material used to form the first ILD layer 160. The contact openings for the vertical source/drain and gate contacts are etched in the ILD layers 165 and 160 using any suitable lithographic patterning and dry etching methods, which are well known to those of ordinary skill in the art. The vertical contacts 190, 192, and 194 are formed using known materials and known fabrication methods. For example, a thin liner layer (e.g., diffusion barrier layer and/or seed layer) is initially deposited to line the contact openings, followed by the deposition of a metallic material such as tungsten, cobalt, ruthenium, copper, etc., to fill the contact openings with metallic material and form the vertical contacts 190, 192, and 194. Following formation of the vertical contacts 190, 192 and 194, a BEOL (back end of line) process is performed to construct an BEOL interconnect structure to provide connections to/between the MOL contacts 190, 192, and 194 and other active or passive devices that are formed as part of the front-end-of-line (FEOL) layer.

It is to be understood that the methods discussed herein for fabricating vertical FET devices can be readily incorporated within semiconductor processing flows, semiconductor IC devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor integrated circuit device, comprising:
   etching a surface of a semiconductor substrate to form vertical semiconductor fins of a field-effect transistor device, wherein each vertical semiconductor fin comprises an upper portion with vertical sidewalls that define a first width of the upper portion, and a thinned bottom portion with concave sidewall surfaces that undercut the upper portion of the vertical semiconductor fin and define a second width of the thinned bottom portion, wherein the second width is less than the first width;
   forming a doped epitaxial source/drain layer on exposed surfaces of the semiconductor substrate and the concave sidewall surfaces of the thinned bottom portion of each of the vertical semiconductor fins, wherein portions of the doped epitaxial source/drain layer disposed between the vertical semiconductor fins comprise raised curved surfaces and wherein portions of the doped epitaxial source/drain layer are disposed in regions adjacent to the concave sidewall surfaces of the thinned bottom portions below the upper portions of the vertical semiconductor fins;
   forming a bottom spacer layer on the doped epitaxial source/drain layer, wherein portions of the bottom spacer layer disposed on the portions of the doped epitaxial source/drain layer between the vertical semiconductor fins have a curved-shaped profile with a non-uniform thickness; and
   performing a thermal anneal process to drive dopants from the doped epitaxial source/drain layer into the thinned bottom portion of each of vertical semiconductor fins and thereby form source/drain extension regions, wherein the doped epitaxial source/drain layer and the source/drain extension regions collectively form a bottom source/drain region of the field-effect transistor device, and wherein the source/drain extension regions do not extend below the doped epitaxial source/drain layer.

2. The method of claim 1, wherein the portions of the doped epitaxial source/drain layer disposed between the vertical semiconductor fins comprise an oval-shaped cross-sectional profile.

3. The method of claim 1, wherein the portions of the bottom spacer layer disposed between the vertical semiconductor fins comprise a crescent-shaped profile.

4. The method of claim 1, wherein the portions of the bottom spacer layer disposed between the vertical semiconductor fins have a non-uniform thickness profile which is thickest at a mid-point between adjacent vertical semiconductor fins and which is thinnest at end portions adjacent to bottom regions of the upper portions of the vertical semiconductor fins.

5. The method of claim 1, wherein forming the doped epitaxial source/drain layer comprises epitaxially growing an in-situ doped layer of semiconductor material on the exposed surfaces of the semiconductor substrate and the concave sidewall surfaces of the thinned bottom portions of the vertical semiconductor fins.

6. The method of claim 1, wherein forming the bottom spacer layer comprises:
   performing a high-density plasma oxide deposition process to form an oxide layer over the doped epitaxial source/drain layer; and
   patterning the oxide layer to form the bottom spacer layer.

7. The method of claim 6, wherein performing the high-density plasma oxide deposition process to form the oxide layer comprises performing an anisotropic high-density plasma oxide deposition process wherein a deposition rate of oxide material on lateral surfaces is greater than a deposition rate of the oxide material on vertical surfaces.

8. The method of claim 1, wherein etching the surface of the semiconductor substrate to form the vertical semiconductor fins comprises:
   forming an etch hardmask layer on the surface of the semiconductor substrate, the etch hardmask layer comprising an image that defines the vertical semiconductor fins;
   performing a dry etch process to etch exposed portions of the semiconductor substrate surface down to target level and thereby form the vertical semiconductor fins, wherein each vertical semiconductor fin comprises the upper portion having the first width, and an initial bottom portion having tapered sidewalls and a third width that is greater than the first width of the upper portion of the vertical semiconductor fin;
   forming dielectric sidewall spacers on the vertical sidewalls of the upper portions of the vertical semiconductor fins; and
   performing an isotropic etch process to etch the exposed tapered sidewalls of the initial bottom portions of the vertical semiconductor fins to thereby form the thinned bottom portions of the vertical semiconductor fins with the concave sidewall surfaces that undercut the upper portions of the vertical semiconductor fins.

9. The method of claim 8, wherein the isotropic etch process results in the concave sidewall surfaces and a recessed surface of the semiconductor substrate between adjacent vertical semiconductor fins having a semi-oval-shaped surface profile.

10. The method of claim 1, wherein etching the surface of the semiconductor substrate to form the vertical semiconductor fins comprises:
   forming an etch hardmask layer on the surface of the semiconductor substrate, the etch hardmask layer comprising an image that defines the vertical semiconductor fins;
   performing a first dry etch process to etch exposed portions of the semiconductor substrate surface down to target level and thereby partially form the vertical semiconductor fins, wherein each partially formed vertical semiconductor fin comprises the upper portion with the first width;

forming dielectric sidewall spacers on the vertical sidewalls of the upper portions of the partially formed vertical semiconductor fins;

performing a second dry etch process to etch exposed portions of the semiconductor surface between the vertical semiconductor fins to form initial bottom portions of the vertical semiconductor fins, wherein the initial bottom portions have tapered sidewalls and a third width that is greater than the first width of the upper portions of the vertical semiconductor fins; and performing an isotropic etch process to etch the exposed tapered sidewalls of the initial bottom portions of the vertical semiconductor fins to thereby form the thinned bottom portions of the vertical semiconductor fins with the concave sidewall surfaces that undercut the upper portions of the vertical semiconductor fins.

11. A method for fabricating a semiconductor integrated circuit device, comprising:

etching a surface of a semiconductor substrate to form vertical semiconductor fins of a field-effect transistor device, wherein each vertical semiconductor fin comprises an upper portion with vertical sidewalls that define a first width of the upper portion, and a thinned bottom portion with concave sidewall surfaces that undercut the upper portion of the vertical semiconductor fin and define a second width of the thinned bottom portion, wherein the second width is less than the first width;

forming a doped epitaxial source/drain layer on exposed surfaces of the semiconductor substrate and the concave sidewall surfaces of the thinned bottom portion of each of the vertical semiconductor fins, wherein portions of the doped epitaxial source/drain layer disposed between the vertical semiconductor fins comprise raised curved surfaces and wherein portions of the doped epitaxial source/drain layer are disposed in regions adjacent to the concave sidewall surfaces of the thinned bottom portions below the upper portions of the vertical semiconductor fins;

forming a bottom spacer layer on the doped epitaxial source/drain layer, wherein portions of the bottom spacer layer disposed on the portions of the doped epitaxial source/drain layer between the vertical semiconductor fins comprise a crescent-shaped structure which is thickest at a mid-point between the vertical semiconductor fins and which is thinnest at end portions adjacent to bottom regions of the upper portions of the vertical semiconductor fins;

forming a metal gate structure over the bottom spacer layer and surrounding the upper portions of the vertical semiconductor fins;

performing a thermal anneal process to drive dopants from the doped epitaxial source/drain layer into the thinned bottom portions of the vertical semiconductor fins and thereby form source/drain extension regions with sharp junctions between the source/drain extension regions and channel regions in the upper portions of the vertical semiconductor fins, wherein the doped epitaxial source/drain layer and the source/drain extension regions collectively form a bottom source/drain region of the field-effect transistor device, and wherein the source/drain extension regions do not extend below the doped epitaxial source/drain layer;

forming an upper spacer layer on the metal gate structure; and forming upper source/drain layers on top of the upper portions of the vertical semiconductor fins, wherein the upper spacer layer electrically insulates the upper source/drain layers from the metal gate structure.

12. The method of claim 11, wherein forming the doped epitaxial source/drain layer comprises epitaxially growing an in-situ doped layer of semiconductor material on the exposed surfaces of the semiconductor substrate and the concave sidewall surfaces of the thinned bottom portions of the vertical semiconductor fins.

13. The method of claim 12, wherein forming the bottom spacer layer comprises:

performing an anisotropic high-density plasma oxide deposition process to form an oxide layer on the doped epitaxial source/drain layer, wherein a deposition rate of oxide material on lateral surfaces is greater than a deposition rate of the oxide material on vertical surfaces; and performing an etch back process to pattern the oxide layer and thereby form the bottom spacer layer.

14. The method of claim 11, wherein the portions of the doped epitaxial source/drain layer disposed between the vertical semiconductor fins comprise an oval-shaped cross-sectional profile.

15. The method of claim 11, wherein etching the surface of the semiconductor substrate to form the vertical semiconductor fins comprises:

forming an etch hardmask layer on the surface of the semiconductor substrate, the etch hardmask layer comprising an image that defines the vertical semiconductor fins;

performing a dry etch process to etch exposed portions of the semiconductor substrate surface down to target level and thereby form the vertical semiconductor fins, wherein each vertical semiconductor fin comprises the upper portion having the first width, and an initial bottom portion having tapered sidewalls and a third width that is greater than the first width of the upper portion of the vertical semiconductor fin;

forming dielectric sidewall spacers on the vertical sidewalls of the upper portions of the vertical semiconductor fins; and performing an isotropic etch process to etch the exposed tapered sidewalls of the initial bottom portions of the vertical semiconductor fins to thereby form the thinned bottom portions of the vertical semiconductor fins with the concave sidewall surfaces that undercut the upper portions of the vertical semiconductor fins.

16. The method of claim 15, wherein the isotropic etch process results in the concave sidewall surfaces and a recessed surface of the semiconductor substrate between adjacent vertical semiconductor fins having a semi-oval-shaped surface profile.

* * * * *